United States Patent
Potter (10) Patent No.: US 11,120,987 B2
(45) Date of Patent: Sep. 14, 2021

(54) NONSTOICHIOMETRIC STRUCTURES WITH MULTIPLE CONTROLLED BANDGAP ENERGY LEVELS AND METHODS THEREOF

(71) Applicant: Nth Tech Corporation, Churchville, NY (US)

(72) Inventor: Michael D. Potter, Churchville, NY (US)

(73) Assignee: NTH TECH CORPORATION, Churchville, NY (US)

(*) Notice: Subject to any disclaimer, the term of this patent is extended or adjusted under 35 U.S.C. 154(b) by 217 days.

(21) Appl. No.: 16/596,150

(22) Filed: Oct. 8, 2019

(65) Prior Publication Data
US 2021/0104636 A1   Apr. 8, 2021

(51) Int. Cl.
| | |
|---|---|
| *H01L 21/02* | (2006.01) |
| *H01L 29/66* | (2006.01) |
| *H01L 21/28* | (2006.01) |
| *H01L 29/51* | (2006.01) |
| *H01L 29/792* | (2006.01) |

(52) U.S. Cl.
CPC .. *H01L 21/02164* (2013.01); *H01L 21/02181* (2013.01); *H01L 21/02205* (2013.01); *H01L 21/02208* (2013.01); *H01L 21/02271* (2013.01); *H01L 29/40117* (2019.08); *H01L 29/513* (2013.01); *H01L 29/517* (2013.01); *H01L 29/66833* (2013.01); *H01L 29/7923* (2013.01)

(58) Field of Classification Search
CPC ......... H01L 21/02104; H01L 21/02107; H01L 21/02112; H01L 21/02123; H01L 21/02164; H01L 21/02205; H01L 21/02208; H01L 21/02225; H01L 21/0226; H01L 21/02271; H01L 21/02365; H01L 21/02436; H01L 21/02518; H01L 21/02554; H01L 29/401; H01L 29/40117; H01L 29/408; H01L 29/43; H01L 29/51; H01L 29/511; H01L 29/517; H01L 29/66007; H01L 29/66409; H01L 29/66477; H01L 29/66833; H01L 29/78; H01L 29/786; H01L 29/792; H01L 29/7923

See application file for complete search history.

(56) References Cited

U.S. PATENT DOCUMENTS

2015/0004805 A1 * 1/2015 Omstead ............. H01L 21/0217
438/786

OTHER PUBLICATIONS

Ploetz, E. et al., "Selective Functionalization of Patterned Glass Surfaces", Molecular Microscopy Research Group & Single-molecule Biophysics, Zernike Institute for Advanced Materials, University of Groningen, The Netherlands, Jan. 29, 2014.

(Continued)

*Primary Examiner* — Cheung Lee
(74) *Attorney, Agent, or Firm* — Troutman Pepper Hamilton Sanders LLP (57) ABSTRACT

A method and resulting structure that includes depositing two or more elements on a substrate. A rate of one of the two or more elements provided during the depositing is restricted to target where one or more energy levels are set within a bandgap of a nonstoichiometric structure generated by the depositing. The generated nonstoichiometric bandgap structure with the one or more set energy levels within the bandgap is provided.

16 Claims, 7 Drawing Sheets

(56) References Cited

OTHER PUBLICATIONS

Kittel, C., "Semiconductor Band Gaps", Introduction to Solid State Physics, 6th Ed., New York: John Wiley, 1986, p. 185.
Robertson, J., "High Dielectric Constant Oxides", Eur. Phys. J. Appl. Phys. 28, 265-291 (2004).

* cited by examiner

$HfO_{2-x}$ I-V

Eur. Phys. J. Appl. Phys. 28, 265-291 (2004)
DOI: 10.1051/epjap:2004206

High dielectric constant oxides

J. Robertson

Engineering Department, Cambridge University, Cambridge CB2 1PZ, UK

| | K | Gap (eV) |
|---|---|---|
| Si | | 1.1 |
| SiO$_2$ | 3.9 | 9 |
| Si$_3$N$_4$ | 7 | 5.3 |
| Al$_2$O$_3$ | 9 | 8.8 |
| Ta$_2$O$_5$ | 22 | 4.4 |
| TiO$_2$ | 80 | 3.5 |
| SrTiO$_3$ | 2000 | 3.2 |
| ZrO$_2$ | 25 | 5.8 |
| HfO$_2$ | 25 | 5.8 |
| HfSiO$_4$ | 11 | 6.5 |
| La$_2$O$_3$ | 30 | 6 |
| Y$_2$O$_3$ | 15 | 6 |
| a-LaAlO$_3$ | 30 | 5.6 |

NONSTOICHIOMETRIC STRUCTURES WITH MULTIPLE CONTROLLED BANDGAP ENERGY LEVELS AND METHODS THEREOF

FIELD

This technology relates to nonstoichiometric structures with multiple controlled bandgap energy levels and methods thereof.

BACKGROUND

Figure 1:
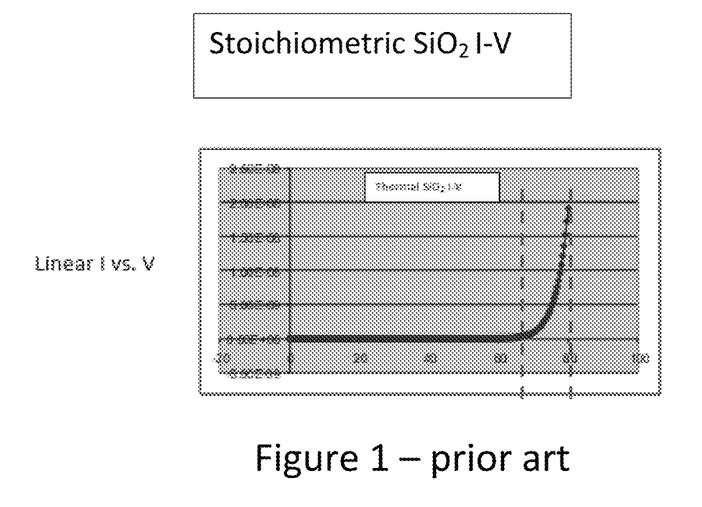
FIG. 1 is a prior art graph of an electrical measurement of current versus applied voltage of a 100 nanometer thin film of stoichiometric silicon dioxide.
Figure 2:
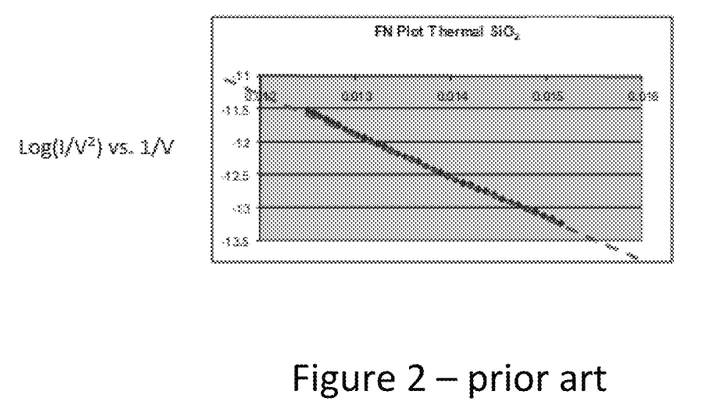
FIG. 2 is a prior art graph of a plot of the log of (current divided by the square of the applied voltage) versus the reciprocal of the applied voltage for the stoichiometric silicon dioxide shown in FIG. 1.

A prior art graph of an electrical measurement of current versus applied voltage of a 100 nanometer thin film of stoichiometric silicon dioxide is illustrated in FIG. 1. In this example, the stoichiometric silicon dioxide typically demonstrates onset of electron conduction at approximately 5.5 megavolts per centimeter and approaches breakdown at about 10 megavolts per centimeter. Additionally, a graph of a plot of the log of (current divided by the square of the applied voltage) versus the reciprocal of the applied voltage for this stoichiometric silicon dioxide is illustrated in FIG. 2.

As illustrated and described above with reference to FIGS. 1 and 2, this operational data is typical of a well-known 9 eV bandgap of stoichiometric silicon dioxide with no allowable energy levels within the bandgap. Accordingly, any applications or designs which utilize this stoichiometric silicon dioxide, as well as other stoichiometric materials, are limited to this particular operational data and properties.

In addition to this operational data, surface properties of these prior stoichiometric materials have posed serious challenges to the attachment of any molecular probes. In particular, prior methods of attaching molecular probes to a surface of a stoichiometric film or other structure have been very costly and complicated. Additionally, the chemistry needed for these prior methods of attaching molecular probes may include certain elements, such as potassium, lithium, and sodium, that are unsuitable and are known contaminates of semiconductors, including Field Effect Transistors, and may change their fundamental electrical parameters.

SUMMARY

A method that includes depositing two or more elements on a substrate. A rate of one of the two or more elements provided during the depositing is restricted to target where one or more energy levels are set within a bandgap of a nonstoichiometric structure generated by the depositing. The generated nonstoichiometric bandgap structure with the one or more set energy levels within the bandgap is provided.

A structure comprising a nonstoichiometric bandgap film comprising two or more deposited elements on a substrate wherein there is a deficiency of at least one of the two or more deposited elements. One or more energy levels are set at one or more targeted levels within a bandgap of the nonstoichiometric bandgap film based on a restricted rate the at least one of the two or more elements was deposited.

A method of making a memory transistor includes forming spaced apart source and drain regions adjacent a first surface of a semiconductor substrate layer. At least one layer is deposited on the first surface of the substrate and over the spaced apart source and drain regions comprising a nonstoichiometric insulator structure with multiple controlled bandgap energy levels and a stoichiometric insulator structure on the nonstoichiometric insulator structure. A gate region is formed on the stoichiometric insulator structure and is positioned between the source and drain regions.

A memory transistor includes a semiconductor substrate layer that has spaced apart source and drain regions formed adjacent a first surface. At least one layer on the first surface of the substrate and over the spaced apart source and drain regions comprises the nonstoichiometric insulator structure with multiple controlled bandgap energy levels and the stoichiometric insulator structure on the nonstoichiometric insulator structure. A gate region is formed on the stoichiometric insulator structure and is positioned between the source and drain regions.

This technology provides a number of advantages including providing nonstoichiometric structures with multiple controlled bandgap energy levels that provide enhanced utility and functionality for a variety of different applications. With examples of this technology, electrons can be trapped at specific set energy levels within the expected electron bandgap of these nonstoichiometric structures. Further, these generated nonstoichiometric structures provide a surface which facilitates ready attachment of one or more molecular probes. Accordingly, with this ability to trap electrons at multiple allowable energy levels within the electronic bandgap and to provide a surface which facilitates ready attachment of one or more molecular probes, these nonstoichiometric materials have a much wider range of potential applications than was previously possible with prior corresponding stoichiometric materials.

DETAILED DESCRIPTION

A nonstoichiometric structure in accordance with examples of this technology is illustrated in FIGS. 3-6. In this particular example the nonstoichiometric structure comprises a wideband gap material which enables electrons to be trapped at multiple targeted energy levels, although the device may comprise other types and/or numbers of other materials. This technology provides a number of advantages including providing nonstoichiometric structures with multiple controlled bandgap energy levels that provide enhanced utility and functionality for a variety of different applications.

Figure 3:
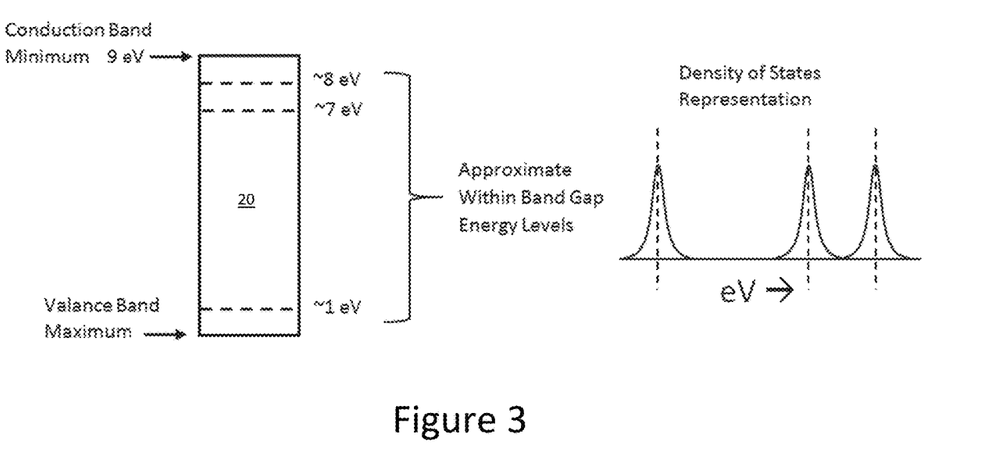
FIG. 3 is a diagram of a representation of allowable energy levels of an example of a 100 nanometer thick film of nonstoichiometric silicon dioxide ($SiO_{2-x}$) in accordance with examples of the claimed technology.

Referring to FIGS. 3-6, an example of a 100 nanometer thick film 20 of nonstoichiometric silicon dioxide ($SiO_{2-x}$) with multiple controlled bandgap energy levels along with graphs of corresponding operational data are illustrated. Referring more specifically to FIG. 3, a diagram of a representation of energy levels of an example of a 100 nanometer thick film of nonstoichiometric silicon dioxide ($SiO_{2-x}$) with multiple controlled bandgap energy levels is illustrated. In this example, the nonstoichiometric silicon dioxide ($SiO_{2-x}$) film or other structure has three illustrated energy levels within the bandgap at about 1 eV, 7 eV and 8 eV and a minimum conduction starting at about 9 eV, although other types of films or other structures with other bandgaps and conduction bands may be used.

An example of a method for making this nonstoichiometric silicon dioxide ($SiO_{2-x}$) film or other structure with multiple controlled bandgap energy levels comprises depositing silicon and oxygen on a substrate. During this deposition, a rate of oxygen is controlled so that the flow is restricted or cutoff so that nonstoichiometric silicon dioxide ($SiO_{2-x}$) film or other structure is generated. In particular, adjustments to the particular rate of oxygen being provided may be made so there is some level of partial or complete oxygen deprivation to enable particular energy levels within the bandgap to be set. In this example, the deposition is continued until a 100 nanometer film or other structure is formed, although other thicknesses may be used. This example also results in at least one outer surface on the nonstoichiometric silicon dioxide film or other structure which facilitates ready attachment of one or more molecular probes. Accordingly, one or more molecular probes may be coupled to this surface on this nonstoichiometric silicon dioxide film or other structure.

Figure 10:
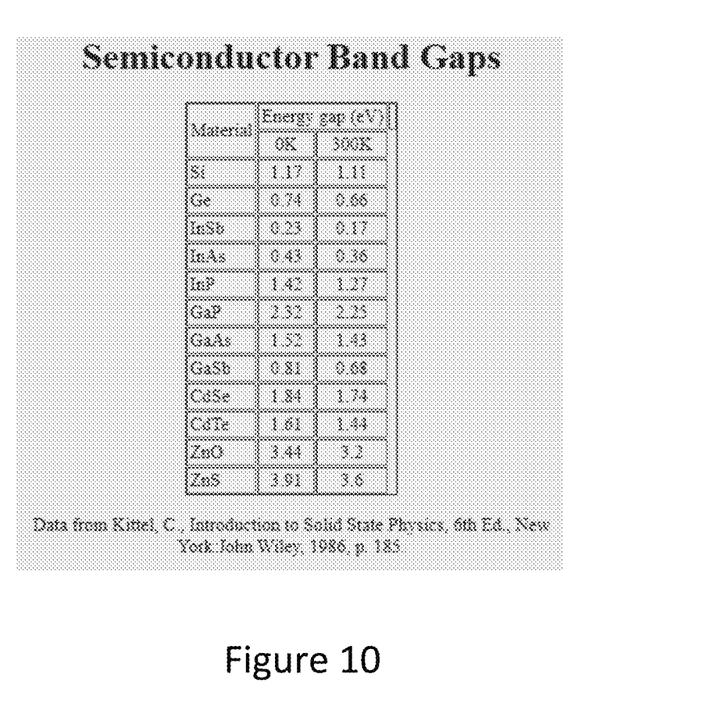
FIG. 10 is a table of an example of bandgaps of semiconductor materials.
Figure 11:
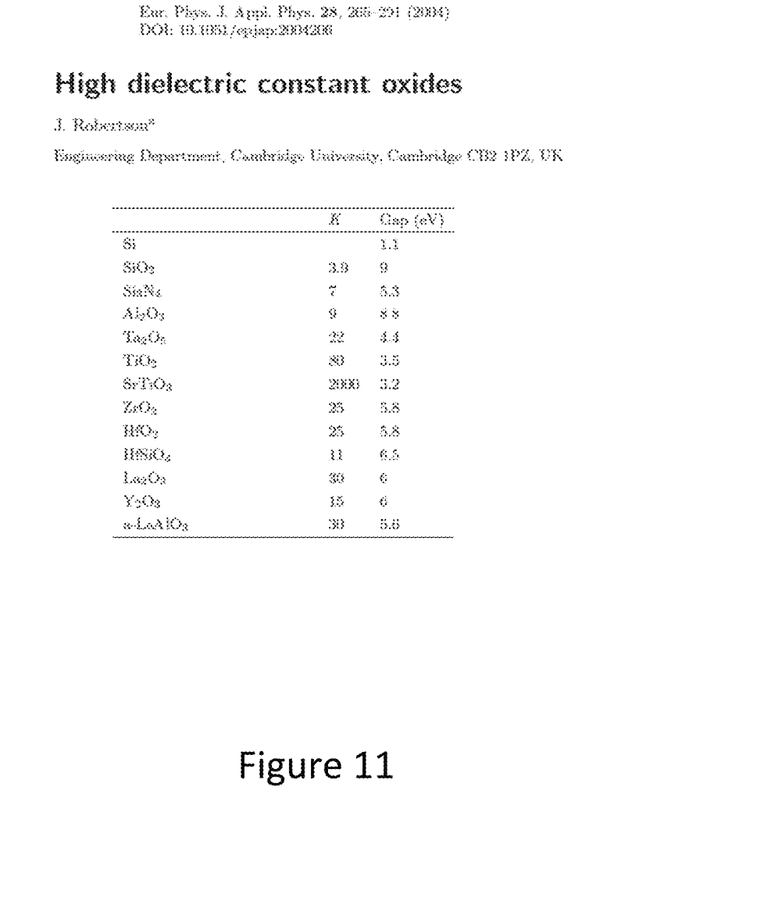
FIG. 11 is a table of an example of bandgaps of semiconductor insulators.

Although an example of forming a nonstoichiometric silicon dioxide film or other structure is illustrated and described above, other types of nonstoichiometric films or other structures made of other types of elements may be used. By way of other example, this technology may comprise or nonstoichiometric insulator films or other structures or nonstoichiometric semiconductor films or other structures, although other types and/or combinations of nonstoichiometric materials may be used. Examples of other types of semiconductors which may be used in forming nonstoichiometric structures are illustrated in FIG. 10 and examples of other insulators which may be used in forming nonstoichiometric structures are illustrated in FIG. 11.

Figure 4:
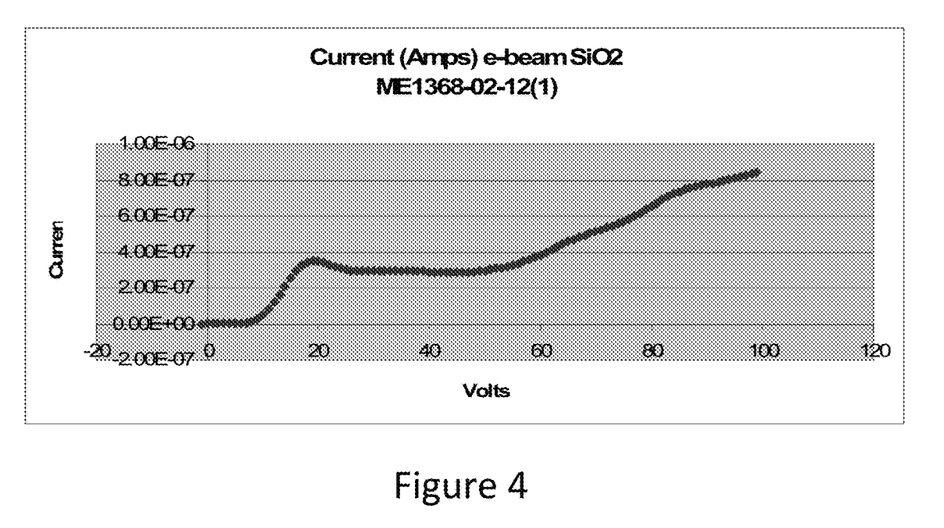
FIG. 4 is a graph of an example of current versus voltage of the nonstoichiometric silicon dioxide shown in FIG. 3.

Referring to FIG. 4, an example of current versus voltage of this 100 nanometer thick film of nonstoichiometric silicon dioxide 20 is illustrated. The plotted data shows several departures for this nonstoichiometric silicon dioxide film 20 from the characteristics of stoichiometric silicon dioxide illustrated and described earlier with reference to FIGS. 1 and 2. In particular, in this example as illustrated in this graph there is an onset of conduction at low applied voltage, followed by negative differential resistance, and then inflections of further increases in current as the voltage approaches the expected final breakdown voltage.

Figure 5:
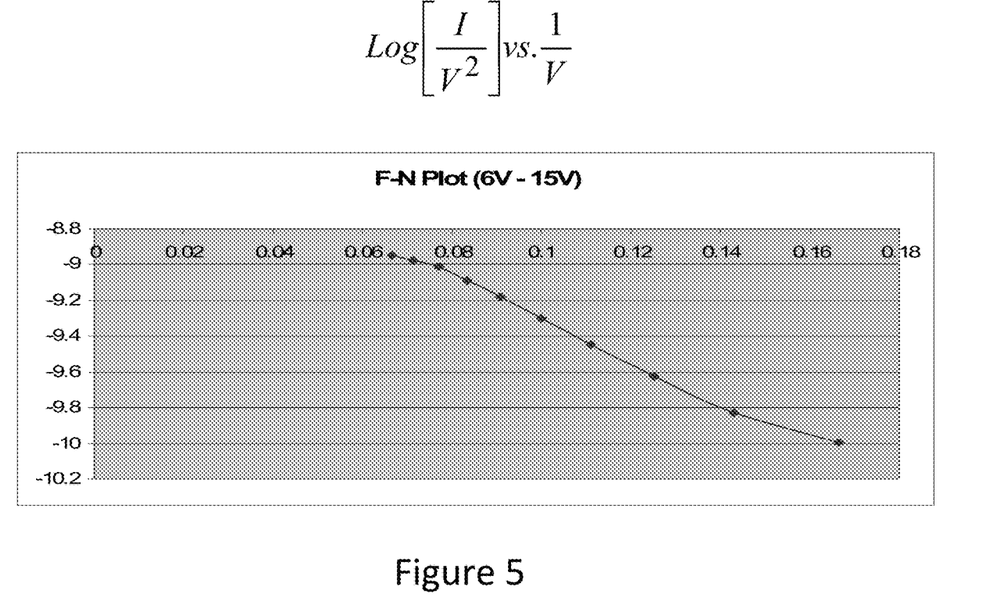
FIG. 5 is a graph of an example of a plot of the log of (current divided by the square of the applied voltage) versus the reciprocal of the applied voltage for the region of early onset of current versus voltage for the nonstoichiometric silicon dioxide shown in FIG. 4.

Referring to FIG. 5, an example a plot of the log of (current divided by the square of the applied voltage) versus the reciprocal of the applied voltage for the region of early onset of current versus voltage for this 100 nanometer thick film of nonstoichiometric silicon dioxide 20 is illustrated. In particular, in this example the plot demonstrates electrical conduction at a level of applied voltage significantly below the value expected for stoichiometric silicon dioxide.

Figure 6:
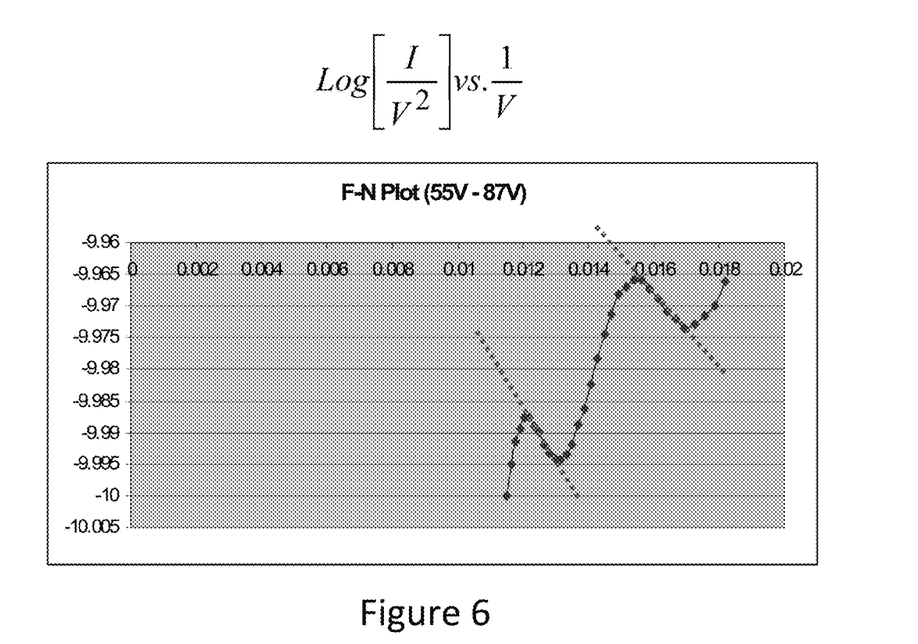
FIG. 6 is a graph of an example of a plot of log of (current divided by the square of the applied voltage) versus the reciprocal of the applied voltage for the second and third regions of exponential increase of current with respect to the applied voltage for the nonstoichiometric silicon dioxide shown in FIG. 4.

Referring to FIG. 6, an example of a plot of log of (current divided by the square of the applied voltage) versus the reciprocal of the applied voltage for the second and third regions of exponential increase of current with respect to the applied voltage for this 100 nanometer thick film of nonstoichiometric silicon dioxide 20 is illustrated. The plot clearly shows two other regions where the current divided by the square of the applied voltage increases hyper-exponentially when plotted against the reciprocal of voltage. Additionally, FIGS. 5 and 6 together demonstrate at least three allowable energy levels within the expected electronic bandgap for this 100 nanometer thick film of nonstoichiometric silicon dioxide 20.

Figure 7:
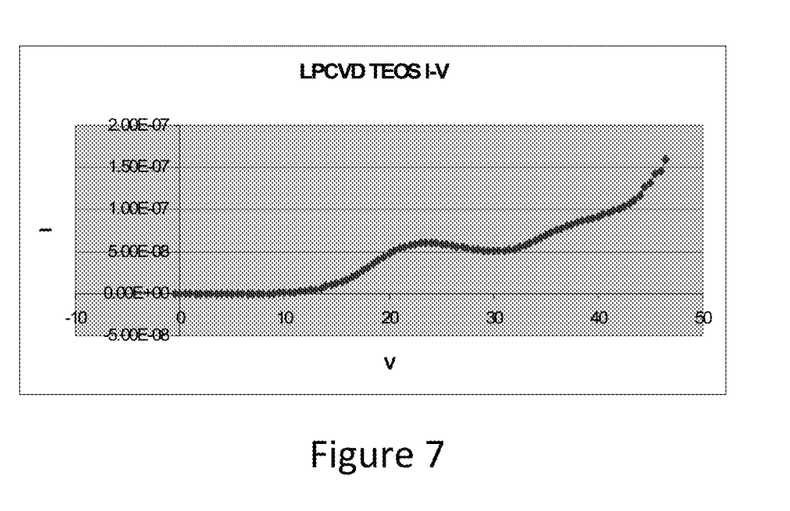
FIG. 7 is a graph of an example of current versus voltage characteristics of thin film deposition of another nonstoichiometric silicon dioxide using TEOS (Tetraethyl Orthosilicate) as a precursor with no added oxygen in accordance with other examples of the claimed technology.
Figure 8:
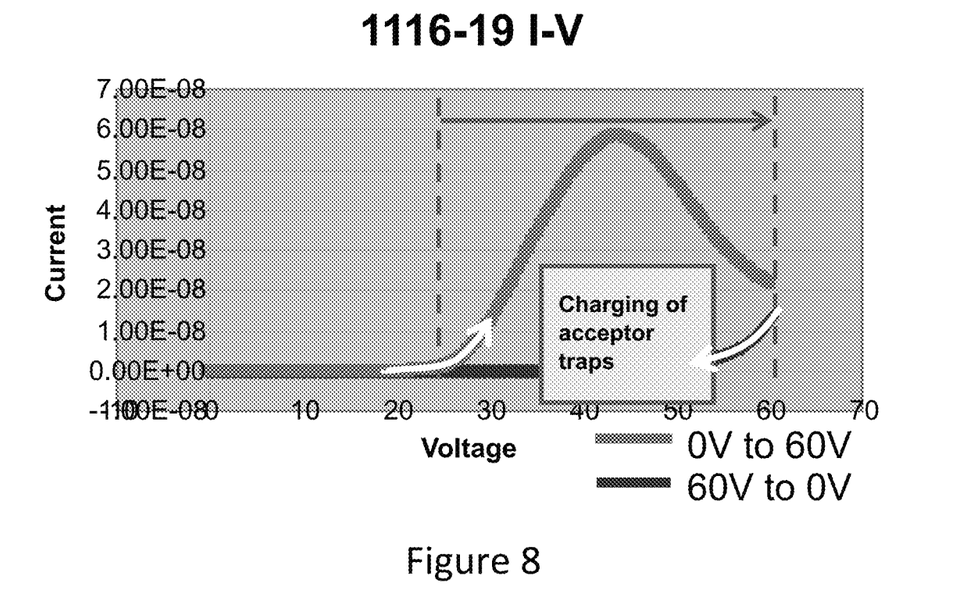
FIG. 8 is a graph of an example of current versus voltage illustrating significant negative differential resistance for the nonstoichiometric silicon dioxide using TEOS as the precursor with no added oxygen.

Referring to FIGS. 7-8, an example of corresponding operational data for another 100 nanometer thick film of nonstoichiometric silicon dioxide ($SiO_{2-x}$) with multiple controlled bandgap energy levels where TEOS (Tetraethyl Orthosilicate) was added as a precursor with limited oxygen are illustrated, although other types and/or numbers of precursors may be used. The structure of the another 100 nanometer thick film of nonstoichiometric silicon dioxide is the same as the 100 nanometer thick film of nonstoichiometric silicon dioxide 20 shown in FIGS. 3-6, except as otherwise illustrated or described with reference to FIGS. 7-8 herein. In particular, in this example FIG. 7 shows current versus voltage characteristics of this 100 nanometer thick film of nonstoichiometric silicon dioxide ($SiO_{2-x}$) where TEOS (Tetraethyl Orthosilicate) as the precursor and no added oxygen. Additionally, FIG. 8 shows current vs. voltage with significant negative differential resistance for this 100 nanometer thick film of nonstoichiometric silicon dioxide ($SiO_{2-x}$) where TEOS (Tetraethyl Orthosilicate) is added as a precursor and with no added oxygen. This characteristic of significant negative differential resistance demonstrates a retarding electric field due to a buildup of stored electron charge.

An example of a method for making this nonstoichiometric silicon dioxide ($SiO_{2-x}$) with multiple controlled bandgap energy levels where TEOS (Tetraethyl Orthosilicate) is added as a precursor and with no added oxygen is described below. In this example, TEOS is added as a precursor and silicon and oxygen are deposited on a substrate, although other types and/or numbers of materials and/or precursors may be used. During this deposition, the rate of oxygen is controlled so that the flow is cutoff so that limited oxygen is added as this nonstoichiometric silicon dioxide ($SiO_{2-x}$) film or other structure is generated. In this example, the deposition is continued until a 100 nanometer film or other structure is formed, although other thicknesses may be used. This example also results in at least one outer surface on the nonstoichiometric silicon dioxide film or other structure which facilitates ready attachment of one or more molecular probes. Accordingly, one or more molecular probes may be easily and effectively coupled to this material surface on this nonstoichiometric silicon dioxide film or other structure.

Figure 9:
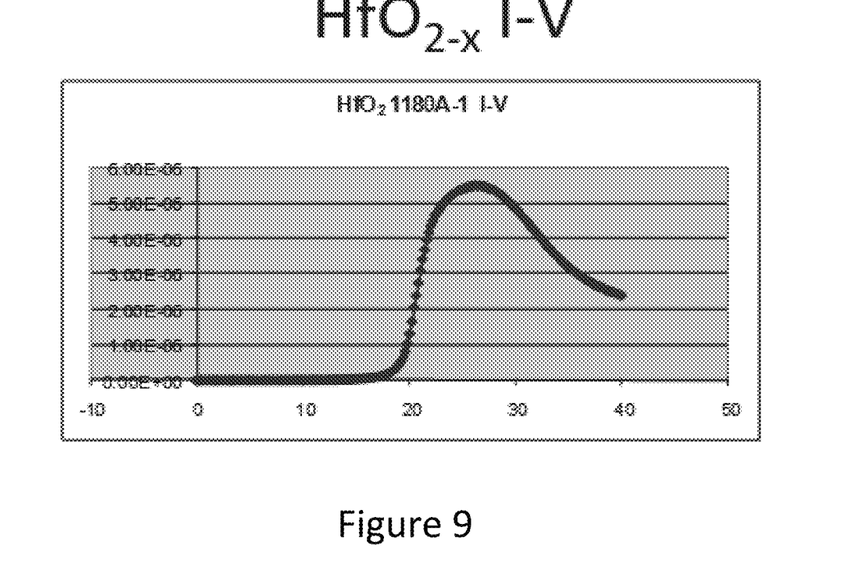
FIG. 9 is a graph of an example of a current vs. voltage illustrating characteristics including stored injected electrons for a thin film of nonstoichiometric hafnium oxide ($HfO_{2-x}$) in accordance with other examples of the claimed technology.

Referring to FIG. 9, another example of corresponding operational data for a 100 nanometer thick film of nonstoichiometric hafnium oxide ($HfO_{2-x}$) with multiple controlled bandgap energy levels is illustrated. The structure of the 100 nanometer thick film of nonstoichiometric hafnium oxide ($HfO_{2-x}$) is the same as the 100 nanometer thick film of nonstoichiometric silicon dioxide 20 shown in FIGS. 3-6, except as otherwise illustrated or described with reference to FIG. 9 herein. In particular, in this example FIG. 9 shows current vs. voltage for this 100 nanometer thick film of nonstoichiometric hafnium oxide ($HfO_{2-x}$) demonstrating the same characteristics as the examples described above and can store injected electrons.

An example of a method for making this nonstoichiometric hafnium oxide ($HfO_{2-x}$) with multiple controlled bandgap energy levels is described below. In this example, hafnium and oxygen are deposited on a substrate, although other types of materials may be deposited. During this deposition, the rate of oxygen is controlled so that the flow is restricted or cutoff so that this nonstoichiometric hafnium oxide ($HfO_{2-x}$) film or other structure is generated. In this example, the deposition is continued until a 100 nanometer film or other structure is formed, although other thicknesses may be used. This example also results in at least one outer surface on this nonstoichiometric hafnium oxide ($HfO_{2-x}$) film or other which facilitates ready attachment of one or more molecular probes. Accordingly, one or more molecular probes may be easily and effectively coupled to this material surface on this nonstoichiometric hafnium dioxide film or other structure.

Each of these examples of nonstoichiometric films or other structures illustrated and described herein has unique advantages for creating high density non-volatile solid-state memory devices. As indicated by either negative differential resistance or by little to no current increase with increasing applied voltage when measuring current versus voltage, these examples of nonstoichiometric films or other structures may be used as a single memory cell that could have four memory states (0, 0', 1', 1) based on the multiple controlled bandgap energy levels. Accordingly, these memory cells would double the memory density compared to the prior two available memory states (0, 1) with stoichiometric films or other structures.

Additionally as discussed earlier each of these examples of nonstoichiometric films or other structures illustrated and described also simplifies bio-molecular probe attachment including for glass slides, other bio-analysis test means surfaces, and biomolecular probes integration with integrated circuits. In particular, these examples of nonstoichiometric insulators when formed as described and illustrated herein provide a surface for direct molecular probe attachment.

Figure 12:
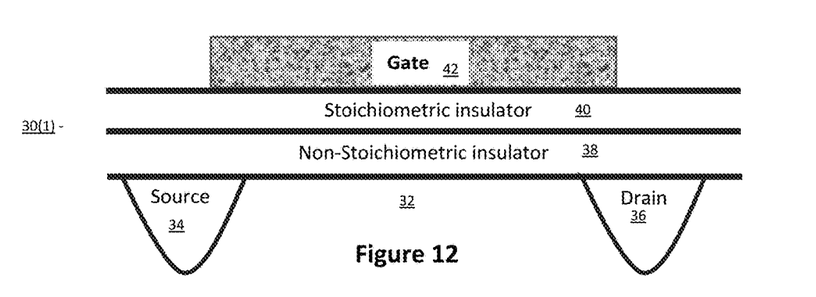
FIG. 12 is a cross-sectional view of an example of a memory transistor utilizing a layer of nonstoichiometric material in accordance with other examples of the claimed technology.

Referring to FIG. 12, an example of a memory transistor 30(1) utilizing a nonstoichiometric film or other structure with multiple controlled bandgap energy levels that enables multiple memory states, such as 0, 0', 1', and 1 is illustrated. In this example, the memory transistor 30(1) comprises a semiconductor substrate layer 32 with spaced apart source and drain regions 34 and 36 formed adjacent a first surface. At least one layer is deposited on the first surface of the substrate 32 and over the spaced apart source and drain regions 34 and 36. The at least one layer may comprise a nonstoichiometric insulator film or other structure 38 with multiple controlled bandgap energy levels, such as one of the examples illustrated and described herein. The at least one layer may also comprise stoichiometric insulator film or other structure 40 is deposited on the nonstoichiometric insulator film or other structure. This stoichiometric insulator film or other structure 40 is a non-conducting layer and enables writing into the nonstoichiometric insulator film or other structure or erasing any stored charge in the nonstoichiometric insulator film or other structure 38 via an appropriate applied voltage to the gate region. In this example the at least one layer is a continuous film, although other numbers of separate layers may be formed. Next, a gate region 42 is formed on the stoichiometric insulator film or other structure so that the gate region 42 is positioned between the source and drain regions. The addition of this nonstoichiometric insulator film or other structure 38 with multiple controlled bandgap energy levels in the memory transistor 30(1) enables multiple memory states, such as 0, 0', 1', and 1 at set energy levels by way of example only.

Figure 13:
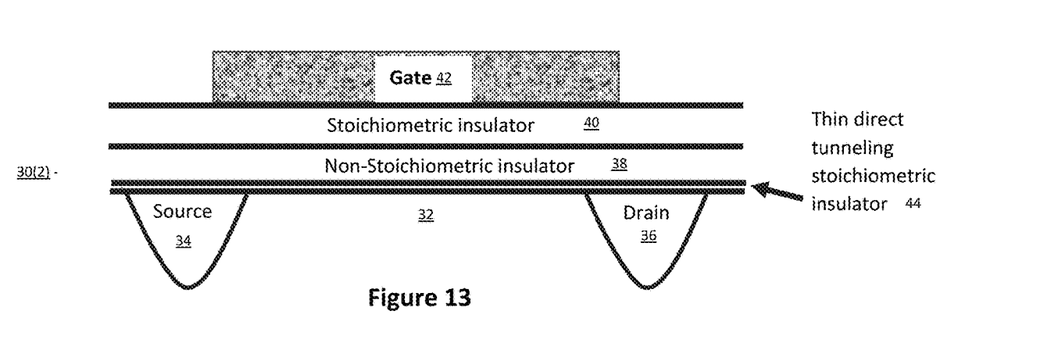
FIG. 13 is a cross-sectional view of an example of another memory transistor with a direct tunneling layer between a semiconductor and a nonstoichiometric material in accordance with other examples of the claimed technology.

Referring to FIG. 13, an example of another memory transistor 30(2) utilizing a nonstoichiometric film or other structure with multiple controlled bandgap energy levels that enables multiple memory states, such as 0, 0', 1', and 1 at set energy levels by way of example is illustrated. The memory transistor 30(2) illustrated in FIG. 13 is the same in structure, manufacture, and operation as the memory transistor 30(1) shown in FIG. 12, except as illustrated and described herein. In this example, an additional very thin direct tunneling layer 44 is formed between the substrate 32 with the spaced apart source and drain regions 34 and 36 and the nonstoichiometric insulator film or other structure 38 with multiple controlled bandgap energy levels for the purpose of maximizing long term memory retention. By way of example, this direct tunneling layer 44 may comprise a layer of silicon dioxide about 1 nm to 2 nm thick, although other types of materials and other thicknesses may be used.

Accordingly, as illustrated and described by way of the examples herein, this technology provides nonstoichiometric structures with multiple controlled bandgap energy levels that provide enhanced utility and functionality for a variety of different applications. With examples of this technology, electrons can be trapped at specific set energy levels within the expected electron bandgap of these nonstoichiometric structures. Further, these generated nonstoichiometric structures provide a surface which facilitates ready attachment of one or more molecular probes. Accordingly, with this ability to trap electrons at multiple allowable energy levels within the electronic bandgap and to provide a surface which facilitates ready attachment of one or more molecular probes, these nonstoichiometric materials have a much wider range of potential applications than was previously possible with prior stoichiometric materials.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method comprising:
depositing two or more elements on a substrate;
restricting a rate of one of the two or more elements provided during the depositing to target where one or more energy levels are set within a bandgap of a nonstoichiometric structure generated by the depositing;
providing the generated nonstoichiometric structure with the one or more set energy levels within the bandgap.

2. The method as set forth in claim 1 wherein the two or more elements comprise silicon and oxygen, the one of the two or more elements comprises the oxygen, and the nonstoichiometric structure comprises silicon dioxide ($SiO_{2-x}$).

3. The method as set forth in claim 1 wherein the nonstoichiometric structure comprising the two or more deposited elements further comprises at least one precursor.

4. The method as set forth in claim 3 wherein the precursor comprises Tetraethyl Orthosilicate (TEOS).

5. The method as set forth in claim 1 further comprising attaching at least one molecular probe to a surface of the generated nonstoichiometric structure.

6. The method as set forth in claim 1 wherein the generated nonstoichiometric structure comprises a bandgap insulator structure or a bandgap semiconductor structure.

7. A structure comprising:
a nonstoichiometric film comprising two or more deposited elements on a substrate wherein there is a deficiency of at least one of the two or more deposited elements; and
one or more energy levels which are set at one or more targeted levels within a bandgap of the nonstoichiometric film based on a restricted rate at which the at least one of the two or more elements was deposited.

8. The structure as set forth in claim 7 wherein the two or more elements comprise silicon and oxygen, the one of the two or more elements comprises the oxygen, and the nonstoichiometric film comprises silicon dioxide ($SiO_{2-x}$).

9. The structure as set forth in claim 7 wherein the nonstoichiometric film comprising the two or more deposited elements further comprises at least one precursor.

10. The structure as set forth in claim 9 wherein the precursor comprises Tetraethyl Orthosilicate (TEOS).

11. The structure as set forth in claim 7 further comprising at least one molecular probe attached to a surface of the nonstoichiometric film.

12. The method as set forth in claim 7 wherein the nonstoichiometric film comprises a nonstoichiometric insulator film or a nonstoichiometric semiconductor film.

13. A method of making a memory transistor comprising:
forming spaced apart source and drain regions adjacent a first surface of a semiconductor substrate layer;
depositing at least one layer on the first surface of the semiconductor substrate layer and over the spaced apart source and drain regions, the at least one layer comprising a nonstoichiometric insulator structure with multiple controlled bandgap energy levels and a stoichiometric insulator structure on the nonstoichiometric insulator structure; and
forming a gate region on the stoichiometric insulator structure, wherein the gate region is positioned between the source and drain regions.

14. The method as set forth in claim 13 further comprising depositing a direct tunneling layer between the semiconductor substrate layer and the nonstoichiometric insulator structure.

15. A memory transistor comprising:
a semiconductor substrate layer with spaced apart source and drain regions formed adjacent a first surface;
at least one film on the first surface of the semiconductor substrate layer and over the spaced apart source and drain regions, the at least one film comprising a nonstoichiometric insulator structure with multiple controlled bandgap energy levels and a stoichiometric insulator structure on the nonstoichiometric insulator structure; and
a gate region on the stoichiometric insulator structure, wherein the gate region is positioned between the source and drain regions.

16. The memory transistor as set forth in claim 15 further comprising a direct tunneling layer between the semiconductor substrate layer and the nonstoichiometric insulator structure of the at least one film.

* * * * *